United States Patent [19]
Yun

[11] Patent Number: 5,910,729
[45] Date of Patent: Jun. 8, 1999

[54] VARIABLE WAVE IMPEDANCE GENERATOR FOR TESTING ELECTRIC AND MAGNETIC FIELD CALIBRATION OF ELECTRONIC EQUIPMENT

[75] Inventor: Jae-Hoon Yun, Daejeon, Rep. of Korea

[73] Assignee: Electronics and Telecommunications Research Institute, Daejeon-shi, Rep. of Korea

[21] Appl. No.: 08/568,830

[22] Filed: Dec. 7, 1995

[30] Foreign Application Priority Data

Dec. 7, 1994 [KR] Rep. of Korea ...................... 94-33099

[51] Int. Cl.$^6$ .................................................. G01R 27/26
[52] U.S. Cl. ............................ 324/627; 324/629; 324/601
[58] Field of Search ................................... 324/637, 639, 324/601, 641, 642

[56] References Cited

U.S. PATENT DOCUMENTS

| | | | |
|---|---|---|---|
| 2,867,781 | 1/1959 | Tomiyasu ................................. | 324/639 |
| 3,115,131 | 12/1963 | Holliday .................................. | 324/639 |
| 4,255,750 | 3/1981 | Riley . | |
| 4,507,602 | 3/1985 | Aguirre .................................... | 324/639 |
| 4,605,916 | 8/1986 | Tehori . | |
| 4,947,127 | 8/1990 | Helms et al. ........................... | 324/639 |
| 5,006,785 | 4/1991 | Revus ...................................... | 324/639 |
| 5,502,393 | 3/1996 | Yamaguchi et al. ..................... | 324/639 |
| 5,610,527 | 3/1997 | Yamaguchi .............................. | 324/639 |
| 5,619,143 | 4/1997 | Stevens et al. .......................... | 324/639 |

OTHER PUBLICATIONS

Cells; IEEE Transactions on Electromagnetic Compatibility, vol. EMC–16, No. 4, Nov. 1974; pp. 189–195.

Das et al.; A Technique of Electromagnetic Interference Measurements with High–impedance Electric and Low–Impedance Magnetic Fields inside a TEM cell.; Dec. 1990 IEEE; pp. 367–369.

Ma et al.; Electromagnetic Fields with Arbitrary Wave Impedances Generated Inside a TEM Cell; Short Papers; IEEE Transactions on Electromagnetic Compatibility, vol. 33, No. 4, Nov. 1991; pp. 358–362, Dec. 1991.

Myron L. Crawford; Generation of Standard EM Fields Using TEM Transmission, Nov. 1974 pp. 180–193.

*Primary Examiner*—Maura Regan
*Attorney, Agent, or Firm*—Jacobson, Price, Holman & Stern, PLLC

[57] ABSTRACT

The present invention relates to the variable wave impedance generator (VWIF) which is used for the electric field intensity measuring instructor calibration, the magnetic field intensity measuring instructor calibration, the antenna calibration, and the unnecessary electronic wave interference and tolerance (EMI/EMS) measurement of the electric and electronic equipment using the features to generate the low impedance electronic wave (or, magnetic field) at the point meeting in phase, and the high impedance electronic wave (or electric wave) at the point meeting out of phase, when the power transmits in the coupled transmission line inside in the opposite direction from each other.

7 Claims, 5 Drawing Sheets

VARIABLE WAVE IMPEDANCE GENERATOR FOR TESTING ELECTRIC AND MAGNETIC FIELD CALIBRATION OF ELECTRONIC EQUIPMENT

TECHNICAL FIELD OF INVENTION

The present invention relates the variable wave impedance generator (VWIF) which is used for the electric field intensity measuring instructor calibration, the magnetic field intensity measuring instructor calibration, the antenna calibration, and the unnecessary electronic wave interference and tolerance (EMI/EMS) measurement of the electric and electronic equipment using the features to generate the low impedance electronic wave (or, magnetic field) at the point meeting in phase, and the high impedance electronic wave (or electric wave) at the point meeting out of phase, when the power transmits in the coupled transmission line inside in the opposite direction from each other.

BACKGROUND OF THE INVENTION

The conventional provision for generating the high impedance electronic wave has had the loop antenna. However, such a provision affects to or is affected by the outer electronic wave environment as being exposed at the outer thereof.

Therefore, performing the test much as the pulse magnetic field tolerance is to perform the test in the position in which the electronic wave is not leaked in the outside by testing in the shielded room.

The conventional method using the TEM cell also is a method using the electronic wave reflected by installing the variable resister in one terminal, and transmitting the power to other terminal.

However, it is the problem which can not support the test for the wide band signal such as the pulse magnetic field tolerance, and must alter the position depending upon each of the frequency in the antenna calibration for the magnetic or electric field measurement, since the TEM cell has the different wave impedance depending upon the frequency in the testing area positioning the objected or measuring testing matter.

SUMMARY OF THE INVENTION

It is an object of the present invention to solve the conventional problem as mentioned hereinabove to provide the variable wave impedance generator having a certain wave impedance for performing the test regardless of the outer electronic wave environment, and independent of the frequency at the measuring testing matter area positioning the measuring testing matter.

In the other words, it is object of the present invention to provide the variable wave impedance generator for performing regardless of the outer electronic wave environment for calibrating for the general receiving the transmitting antenna including a number kind of the electric field antenna, the magnetic antenna etc. beginning the magnetic field, electric field and plane wave calibration tests, and forming a certain uniform wave impedance independent of the frequency in the testing area positioning the measuring testing matter as handling the variable attenuator alone. The featured-structure according to the present invention to accomplish the mentioned objects can be seen by conveniently dividing into the areas as follows.

The variable wave impedance generator to accomplish the mentioned objects of the present invention comprises as measuring testing matter area portion having the structure of the coupled transmission line symmetrically positioning in the spherical outer conductor as the portion positioning the measuring testing matter; the coaxial connector connected area portion designed in the step-by-step sharp access to be able to transmit the high power, and at the same time impedance-match the structure of the variable impedance wave generator with the different coaxial connector sectional structure; the taper area portion for connecting the coaxial connector area portion to said measuring testing matter area; and the variable mounting portion adjustable to be able to be variable a certain wave impedance in said measuring testing matter area.

BRIEF DESCRIPTION OF THE DRAWINGS

Further features and advantages will become more apparent from the following and a more particular description of the preferred embodiment of the invention, as Illustrated in the accompanying drawings. Corresponding numerals and symbols in the different figures refer to corresponding parts unless otherwise indicated, and in which.

DETAILED DESCRIPTION OF THE INVENTION

Figure 1:
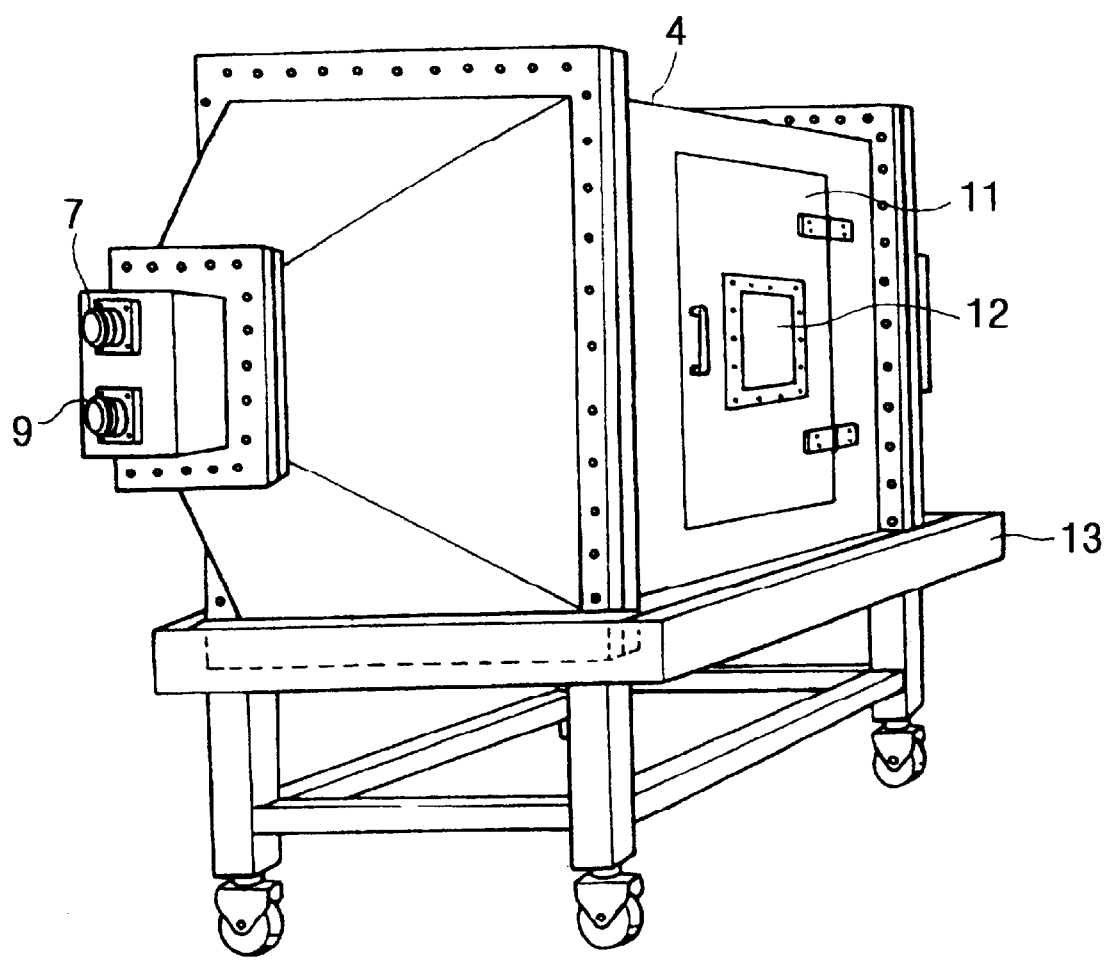
FIG. 1 is the schematic perspective view illustrating the structure of the variable wave impedance generator according to the present invention.
Figure 2A:
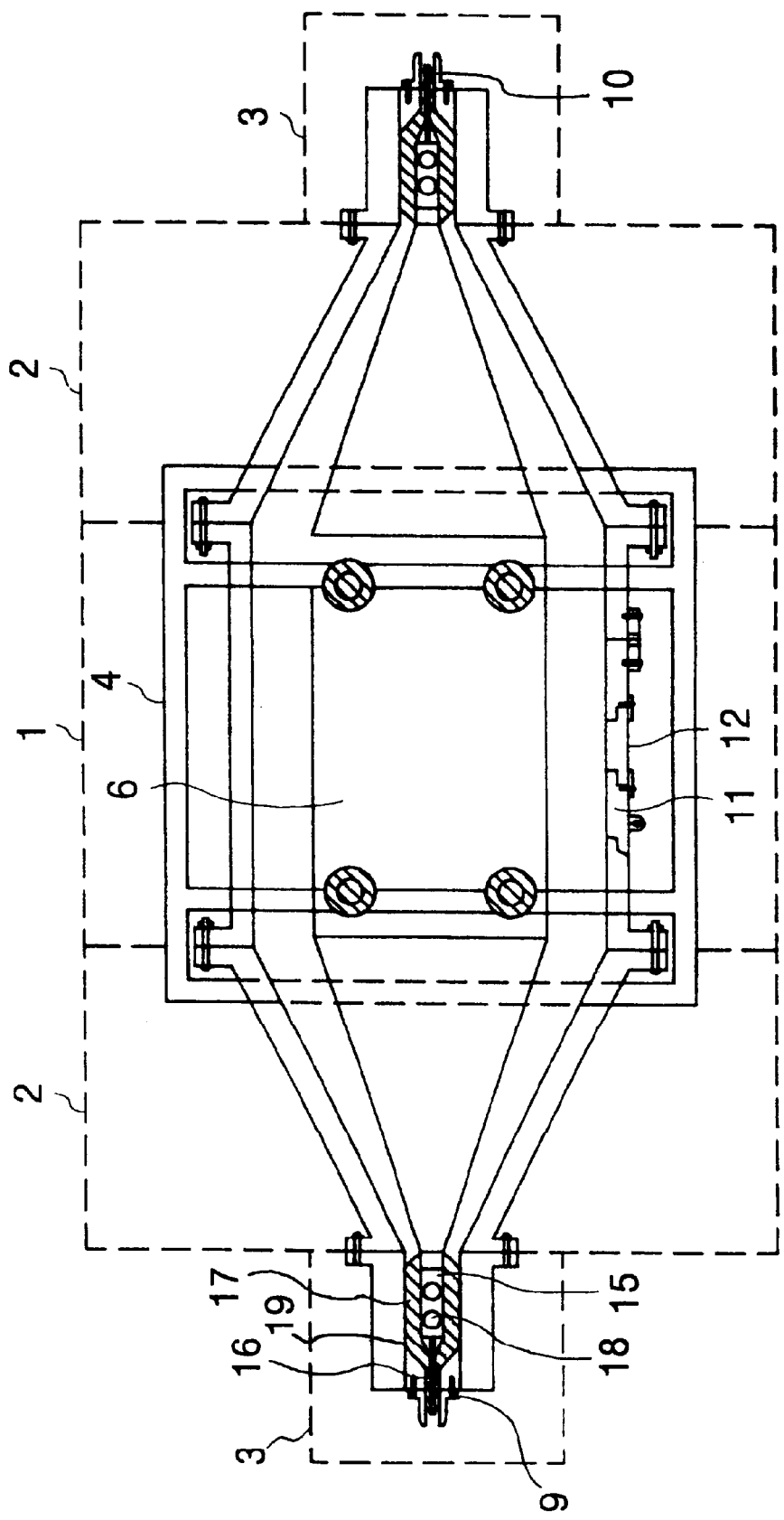
FIG. 2(A), (B) and (C) are the plan view, the sectional front view and the sectional side view illustrating the principal structure of the variable wave impedance generator according to the present invention, respectively.
Figure 2B:
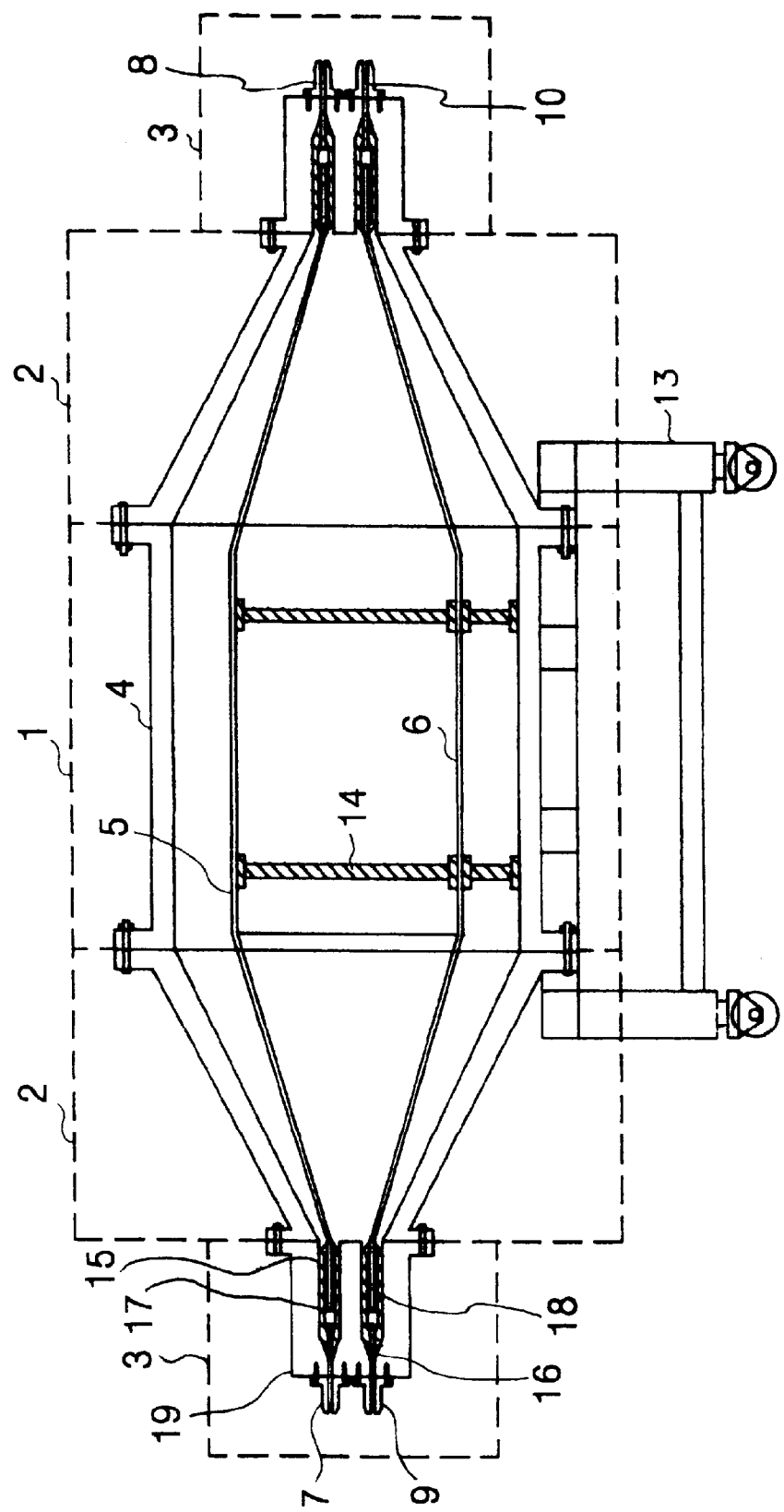
Figure 2C:
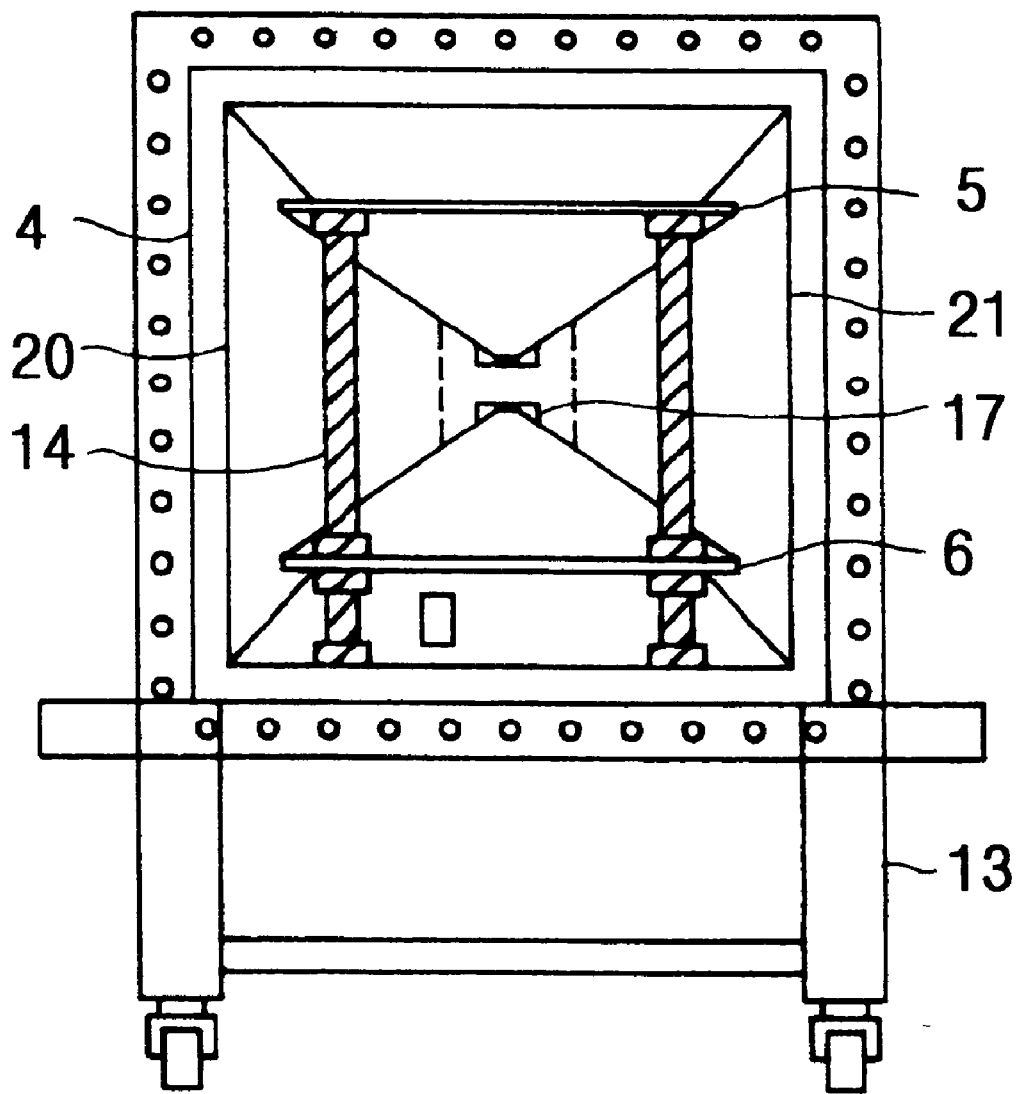
Figure 3:
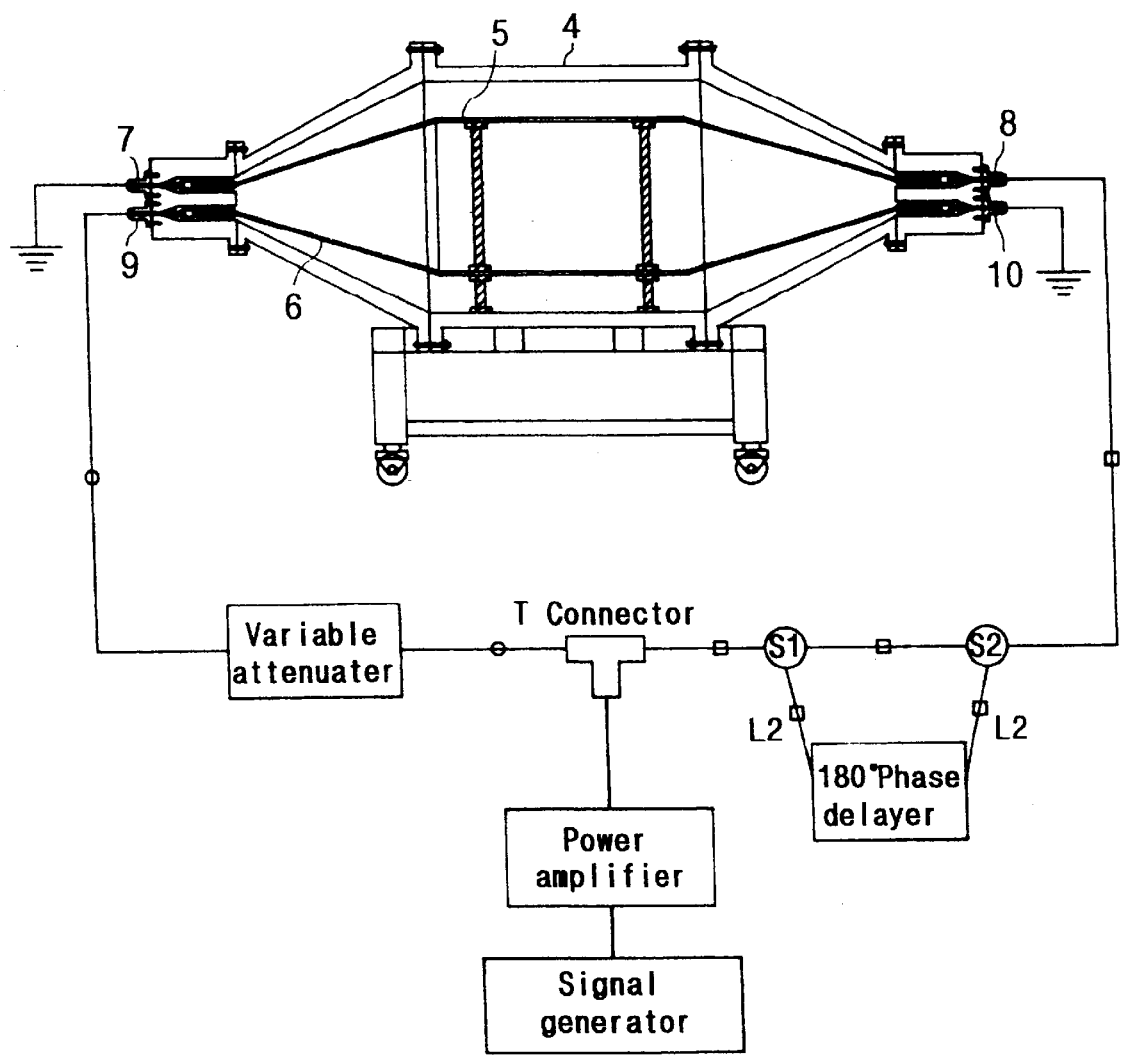
FIG. 3 is the structure view illustrating an example of the system for generating a certain wave impedance using the variable wave impedance generator according to the present invention.

A preferred embodiment of the present invention referring to FIGS. 1 through 3 will be now in detail described as follows:

FIG. 1 is the schematic perspective view illustrating the structure of the variable wave impedance generator according to the present invention, FIGS. 2 illustrates the principal structure of the variable wave impedance generator according to the present invention, respectively, in which FIG. 2(A) is the plan view thereof FIG. 2(B), the sectional front view thereof, and FIG. 2 (C) the sectional side view thereof, FIG. 3 is the structure view illustrating an example of the system for generating a certain wave impedance using the variable wave impedance generator according to the present invention. Referring to the drawings, the reference numeral 1 refers in general to the measuring testing area, the reference numeral 2 refers to the taper area, and the reference numeral 3 refers to the coaxial connector connected area, respectively.

The reference numeral 4 also denotes the first outer conductor, the reference numeral 5 denotes the first inner conductor, the reference numeral 6 denotes the second inner conductor, the reference numeral 7 denotes the first left-end N-type connecter, the reference numeral 8 denotes the first right-end N-type connecter, the reference numeral 9 denotes the second left-end N-type connecter, the reference numeral 10 denotes the second right-end N-type connecter, the reference numeral 11 denotes the door, the reference numeral 12 denotes the shield window, the reference 13 denotes the prop, the reference numeral 14 denotes a supporter, the reference numeral 15 denotes the third inner conductor (the reference numeral 16 denotes an inner conductor pin), the reference numeral 17 denotes an inner dielectric substance, the reference numeral 18 denotes an screw, and the reference numeral 19 deotes the second outer conductor, respectively.

The structure of the measuring testing area 1 has the coupled transmission line as shown in FIGS. 1 and 2, in which it comprises two inner conductors 5 and 6 positioned in the upper and lower symmetry, a prop 14 supporting therewith, the door 11, and the shield window 12.

The uniform field region means the one-third center area (JEC 1000-4-3 CISPR 24 etc.) between the measuring testing area, the inner conductor and the outer conductor, in which the uniformity of the area is higher the feature than the general TEM cell. While for the general TEM cell, the uniformity of the magnetic field distribution is destroyed by the affection of the electromagnetic field generated due to the potential difference between the outer conductors 16 and 17, and the inner conductor, because according to the featured-structure of the present invention, the magnetic field forwarding to both outer conductors and the magnetic component formed perpendicular to which the magnetic direction become weak from each other by positioning the inner conductor in the upper and lower symmetry structure, and supplying the voltage for both ends thereof simultaneously.

The measuring testing matter area 1 can be also made the vertical length of the outer conductor (i.e. the height of a plane installed the door 11 in the outer conductor 4 as shown in FIG. 1) larger than horizontal length thereof to ensure the testing space as wide as possible.

As far as the uniformity of the uniform area is within the satisfied range when the vertical length and horizontal length of the outer conductor is defined (It is recognizable as the electronic wave calibrate testing provision that CISPREPUB 24 defines which the magnetic field must by within the 6 dB deflection, and IE (1000-4-3 is which the 6 dB occupancy area rate is 75 percentage or more.), the structure is to accomplish the impedance matching (i.e, 50 ohmic) while the distance between two inner conductors 5 and 6 is widening. This area also installs the door 11 to position the measuring testing matter therein, and installs the shield window 12 which the shield effect is high to confirm the normal operation of the measuring testing matter.

The shield window 12 is comprised by coating the transparency material such as the glass and the plastic with the gold and the silver, and installing the wire mash of the thin metal net.

The coaxial connector connected area 3 is comprised to be able to transmit the high power while holding the impedance matching since the sectional structure of the measuring testing matter area 1 as shown in the sectional side view of FIG. 2C differs from the sectional structure of the coaxial connector.

The constructive components of the coaxial connector connected area 3 comprise the third inner conductor 15, the second outer conductor 19, the inner dielectric substance, the N-type connector 7, 8, 9 and 10, and the screw 18.

The sectional plane of the third inner conductor is to currently hold the spherical-type since the structure of the first inner conductor 5 and the second inner conductor 6 is spherical, and also dividable into the assembly-type, and thus cam also easily again make.

The inner structure receiving the third inner conductor of the second outer conductor has the spherical structure, both the first inner conductor 5 and the second inner conductor 6 is connected with the screw 18 and; the N-type connector is connected with the inner conductor pin 16.

The inner structure of the second outer conductor 19 make in the spherical-type considering the outer conductor structure of the N-type connector.

It is also mounted by inserting the non-conductive (Teflon etc.) dielectric substance 17 of the lower dielectric constant to support the inner conductor 5, 6 and 15.

It can transmit the higher power since the short pass phenomenon largely rasing in the corner portion as coupling step-by-step formation is decreased.

The taper area 2 is a portion connecting the measuring testing matter area to the coaxial connector area, which the sectional type thereof is the same as the area of the measuring testing matter, and has the taper structure to progressively be decreased forward the coaxial connector area.

This structure has the very closely relationship of the soluble frequency together with the structure of the measuring testing matter area.

Smaller the magnitude and the length, smaller the space, but more wide the soluble frequency range.

Therefor, the effective length of such an area must be small while currently holding the magnitude of the area.

The method for making the effect length smaller is a method substituting for the curve-type.

That is, it is constructed that the center thereof is formed in the spiral type in view of the inner direction forward the area portion, and on the contrary, the center thereof is formed in the spiral type in view of the outer direction forward the coaxial connector connected area portion.

FIG. 3 is the structure view illustrating an example of the system for generating a certain wave impedance using the variable wave impedance generator according to the present invention. The first left-end N-type connector 7 and the second right-end N-type connector 10 are terminated, the first left-end N-type connector 9 is connected to the T connector through the variable attenuator, and the first right-end N R-type connector 9 is connected to the T-connector through the switch S1—the switch S2, or the switch S1—the 180° phase delay unit—the switch S2.

Then, it notice that the total length of each of both connected transmission lines (# and o indicated line) must be same, respectively.

Because it must be transmitted in phase and in the 180° phase difference independence of the frequency in the measuring testing matter area.

Then, the T connector acts as the action to transmit in the bidirection of dividing equally in the two-portions into the power provided with the power amplifier and the signal generator.

While the first inner conductor 5 and the second inner conductor 6 of the measuring testing matter area set off by forming the electric field which the magnitude in the center of each of the measuring testing matter area is same, and the direction thereof is opposite if the phase difference of the outer conductor is in phase and is the same as the voltage, and the magnetic field is the same as the magnitude and the direction thereof is same from each other since the direction of a forwarding wave transmits in the opposite direction, thus having a twice value.

Then, it is possible to construct a certain wave impedance (377 ohmic or less) having the low electric field and the high magnetic field if the voltage of one end is adjusted.

While the first inner conductor 5 and the second inner conductor 6 of the measuring testing matter area set off by generating the electric field which the magnitude in the center of each of the measuring testing matter area is same, and the direction thereof is opposite if the phase difference thereof is 180°, and is the same as the voltage, the magnetic field is the same as the magnitude and the direction thereof is same from each other since the direction of a forwarding wave transmits in the opposite direction, thus having a twice value of the magnetic field.

Then, it is possible to adjust a certain wave impedance (377 ohmic or more) having the low electric field and the high magnetic field if the voltage of one and is adjusted.

The system is constructed so that the phase difference of the inner conductor 5 and 6 is in phase by connecting the switch S1 and the switch S2 with L1, and the desired wave impedance is generated by controlling the variable attenuator, to generate the low impedance electronic wave (or magnetic wave) in the measuring testing matter area using the phenomenon as mentioned hereinabove.

The system is constructed so that the phase difference of the inner conductor 5 and 6 of the measuring testing matter area are 180° by operating the 180° phase delay unit connecting the switch S1 and the switch S2 with L2, and a certain wave impedance is generated by adjusting the variable attenuator, to generate the high impedance (or electric wave).

This system can perform the electronic wave calibration and a number kind of the antenna calibration test putting in the uniform area in existence at the measuring testing matter area adjusting the electronic field having a certain wave impedance in the uniform inner area independence of the frequency.

The variable impedance wave generator according to the present invention is constructed, so that the electronic wave adjustment having a certain wave impedance is possible by adjusting the supply voltage provided with both ends of the inner conductor.

This variable impedance wave generator can also test the wide band electronic wave calibration (the pulsed magnetic wave calibration etc. such as IEC 100-4-9).

The freaured-structure thereof additionally has the effect regardless of the outer electronic wave environment to easily install in the narrow space, and freely move the provision.

In addition, the variable impedance wave generator of the invention can support the electronic wave tolerance test having the high quality of the uniformity in the uniform field area, the electronic tolerance test having the higher reproduction and correction, and correctly correct the specific antenna such as the electric field antenna, the magnetic antenna etc. including the general receiving and transmitting antenna.

While the going disclose the preferred embodiment of the invention, it is to be understand that many change in the detail may be made as a matter of engineering choices without departing from the spirit and scope of the invention as defined by the appended claims. Therefor, all such changes, modification, variations, and other uses and application which do not depart from the spirit and scope of this invention are deemed to be covered by this invention, which is limited only by the claims which follow.

What is claimed is:

1. A variable impedance wave generator for testing electric and magnetic field intensity calibration of electric and electronic equipment, comprising:

a measuring testing matter area including a first inner conductor and a second inner conductor having upper and lower symmetry with each other to perform various tests and calibrations regardless of the outer electronic wave environment;

a first coaxial connector and a second coaxial connector, the first coaxial connector having a first left-end N-type connector and a second left-end N-type connector, the second coaxial connector having a first right-end N-type connector and a second right-end N-type connector, wherein the connectors supply voltage to said inner conductors;

two tapered areas connecting the first and second coaxial connectors to said measuring testing matter area; and a variable impedance providing means for providing variable wave impedance into the measuring testing matter area, which includes:
a signal generator for generating a signal;
a power amplifier for amplifying the signal;
a T-connector for dividing the amplified signal in half and for transmitting the divided signal to a first side and a second side of the T-connector;
a variable attenuator for controlling a signal received from the first side of the T-connector and for transmitting the controlled signal to one of two coaxial connectors;
a phase delayer for shifting the phase of a signal received from the second side of the T-connector in order to generate a high impedance out of phase wave in said measuring testing matter area, and
two switching means for switching a line between the second side of the T-connector and the second coaxial connector either directly or through the phase delayer.

2. The variable impedance wave generator of claim 1, wherein said measuring testing matter are is installed between a second inner conductor by a supporter in upper and lower symmetry, and which has a vertical length that exceeds a horizontal length to ensure a wider testing space.

3. The variable impedance wave generator as claimed in claim 1, further including a third inner conductor located in each of the two coaxial connectors and having a circular cross-section, wherein the first inner conductor and the second inner conductor of the measuring testing matter are have a circular cross-section.

4. The variable impedance wave generator as claimed in claim 1, wherein the first left-end N-type connector and the second right-end N-type connector are terminated, the second left-end N-type connector is connected to a T-connector through a variable attenuator, and the first right-end N-type connector is connected to the T-connector through said two switching means which selectively either directly connects the first right-end N-type connector or through the phase delayer.

5. The variable impedance wave generator as claimed claim 1, wherein the variable impedance providing means is adjusted to a wave impedance by adjusting the variable attenuator.

6. The wave generator as recited in claim 1, wherein said two switching means switch the line in order to generate a high impedance wave in said measuring testing matter area by transmitting the signal received from the second side of the T-connector to the second coaxial connector through said phase delayer, and to generate a low impedance wave in said measuring testing matter area by transmitting a signal received from the second side of the T-connector to the second coaxial connector not through said phase delayer.

7. The wave generator as recited in claim 6, wherein a length of a line between the first coaxial connector and the T-connector is same as that of a line between the second coaxial connector and the T-connector.

* * * * *